United States Patent
Suh et al.

(10) Patent No.: US 7,848,146 B2
(45) Date of Patent: Dec. 7, 2010

(54) PARTIAL LOCAL SELF-BOOSTING OF A MEMORY CELL CHANNEL

(75) Inventors: Youseok Suh, Cupertino, CA (US); Ya-Fen Lin, Saratoga, CA (US); Coling Stewart Bill, Cupertino, CA (US); Takao Akaogi, Cupertino, CA (US); Yi-Ching Wu, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 105 days.

(21) Appl. No.: 12/407,228

(22) Filed: Mar. 19, 2009
(Under 37 CFR 1.47)

(65) Prior Publication Data
US 2010/0238731 A1 Sep. 23, 2010

(51) Int. Cl.
*G11C 16/04* (2006.01)
(52) U.S. Cl. ............................. 365/185.17; 365/185.18; 365/185.25
(58) Field of Classification Search ............ 365/185.17, 365/185.18, 185.23, 185.25, 203
See application file for complete search history.

(56) References Cited
U.S. PATENT DOCUMENTS 7,450,430 B2 * 11/2008 Hemink et al. ......... 365/185.25
7,468,918 B2 * 12/2008 Dong et al. ............ 365/185.25
7,639,540 B2 * 12/2009 Kim et al. ............. 365/185.18

* cited by examiner

*Primary Examiner*—Gene N. Auduong

(57) ABSTRACT

A method for partial local self-boosting of a memory cell channel is disclosed. As a part of memory cell channel partial local self-boosting, an isolating memory cell located on a source side of a program inhibited memory cell is turned off and a gating memory cell located on a drain side of the program inhibited memory cell is used to pass a pre-charge voltage to the program inhibited memory cell to provide a pre-charge voltage to a channel of the program inhibited memory cell. Moreover, a pre-charge voltage is passed to a buffering memory cell located on the source side of the program inhibited memory cell to provide a pre-charge voltage to a channel of the buffering memory cell and the gating memory cell that is located on the drain side of the program inhibited memory cell is turned off. During programming, a program voltage is applied to the gate of the program inhibited memory cell where a channel voltage of the program inhibited memory cell is raised above a level raised by the pre-charge voltage.

20 Claims, 19 Drawing Sheets

PARTIAL LOCAL SELF-BOOSTING OF A MEMORY CELL CHANNEL

BACKGROUND

NAND type flash memory is one of two types of flash memory technologies (the other being NOR) that are currently available. NAND type flash memory is best suited for use in devices requiring high capacity data storage. The architecture of NAND type flash memory provides significantly more storage space, and offers faster erase, write and read capabilities as compared to NOR type flash memory. NAND arrays include a large number of strings of memory cells that are connected through one or more select transistors between individual bit lines and a reference potential. FIG. 1 shows a pair of conventional NAND memory cell strings 100, such as are used in the aforementioned NAND arrays.

In particular, FIG. 1 shows the programming conditions for programming a memory cell of a conventional NAND memory cell string. Referring to FIG. 1, NAND memory cell string pair 100 includes programmed memory cell 101 and program inhibited cell 103. Programmed memory cell 101 is programmed when a programming voltage is applied to the gate terminal of both programmed memory cell 101 and program inhibited cell 103. As part of the programming pass transistors 105, 107, 109 and 111 operate to pass a program voltage to programmed memory cell 101 (e.g., zero volts in the FIG. 1 example). A problem arises when it is desired to program one memory cell on a word line without programming other memory cells located under the same word line, for example, when it is desired to program programmed memory cell 101 and not program inhibited memory cell 103. Because the programming voltage is applied to all memory cells located under a word line that it is applied to, an unselected memory cell (a memory cell that is not intended to be programmed) on the word line may become inadvertently programmed (such as, for example, program inhibited memory cell 103). The unintentional programming of the unselected memory cell is referred to as program disturb.

In general, program disturb is used to describe any unwanted threshold voltage shift, either in the positive or negative direction, which can occur during a programming operation and is not necessarily limited to memory cells associated with a selected word line. A conventional methodology for preventing program disturbs is called channel self-boosting. Channel self-boosting involves a boosting of the "potential" or voltage of the channel regions of memory cells on unselected bit lines through the capacitive coupling of the channels with pass voltages that are applied to the gates of the memory cells. Accordingly, even though a high voltage is applied to the word line associated with a non-selected memory cell, the potential difference between the high voltage applied to the word line and the channel potential is not sufficient to cause electron tunneling through the oxide to the floating gate (because of the boosted channel voltage). Consequently, program disturb is prevented.

In conventional self-boosting applications the uniformity of the channel voltage Vch of the program inhibited memory cell is dependent on the program/erase pattern of the associated memory cell string. It should be appreciated that in such applications Vch may not be uniformly distributed if any memory cell in the memory cell string is programmed. Moreover, in pre-charging applications, Vch as measured on the drain side of the program inhibited memory cell channel may be higher than Vch as measured on the source side of the program inhibited memory cell channel. Accordingly, memory cells on the source side of the program inhibited memory cell are vulnerable to program disturbs. In addition, the voltage difference between Vch as measured on the source and drain sides of the program inhibited memory cell channel can become greater as Vd rises. Several channel self-boosting methodologies for preventing program disturb are described herein below with reference to FIGS. 2A-10C.

FIG. 2A shows programming conditions for a memory cell string employing a conventional local self-boosting (LSB) programming methodology. Referring to FIG. 2A, during programming operations, a programming voltage Vpgm is applied to the gate of program inhibited memory cell 201 and zero volts is applied to the gates of isolating memory cells 207 and 209 that are located adjacent to program inhibited memory cell 201. Moreover, zero volts is applied to the source select gate 203 and three volts is applied to the drain select gate 205 of memory cell string 200. It should be appreciated that the application of zero volts to the gates of memory cells 207 and 209 turns off these memory cells in unselected bit lines and thus isolates program inhibited memory cell 201 such that Vch for program inhibited memory cell 201 is dependent on the programming voltage Vpgm that is applied to its gate. It should be appreciated that the application of the programming voltage Vpgm to the gate of program inhibited memory cell 201 boosts the channel potential Vch of program inhibited memory cell 201 such that the potential difference between the Vpgm and Vch is not sufficient to cause electron tunneling. Thus, in this manner program disturb at program inhibited memory cell 201 can be prevented.

As shown in the FIG. 2C schematic, and as discussed above, using LSB, program inhibited memory cell 201 is isolated from memory cells on its source and drain sides. Moreover, memory cells on its drain side are erased and memory cells on the source side of the program inhibited memory cell 201 are programmed to either one or zero. This is contrasted with other conventional boosting methodologies such as is shown in FIG. 2B, where there is no isolating of the program inhibited memory cell (e.g., 201 in FIG. 2A) and where memory cells on the drain and source sides of the program inhibited memory cell have a pass voltage Vpass applied to their gates.

Referring again to FIG. 2A, conventional local self-boosting (LSB) is characterized by a sequential programming of memory cells from source to drain (e.g., bit line). This process allows zero volts to be passed from the source line to the memory cells that are to be programmed. It should be appreciated that the channel voltage of program inhibited memory cells can reach high voltages in excess of 10 volts. In addition to the structures discussed above, FIG. 2A shows word lines w10-w115 associated with respective memory cells, source line SL, bit line BL and memory cell junctions a0-a16.

FIG. 3A shows programming conditions for a NAND memory cell string 300 employing a conventional LSB programming methodology. Referring to FIG. 3A, during typical programming operations, a programming voltage is applied to the gate of program inhibited memory cell 301. In addition, zero volts is applied to the gate of the source side isolating memory cell 307 that is adjacent to program inhibited memory cell 301 and two volts is applied to the gate of the drain side isolating memory cell 309 that is adjacent to program inhibited memory cell 301. It should be appreciated that during programming operations zero volts is applied to the source select gate 303 and three volts is applied to the drain select gate 305 of memory cell string 300. As shown in FIG. 3A, memory cells other than the adjacent isolating memory cell 309 on the drain side of program inhibited memory cell 301 are erased and have a pass voltage applied to their gates. Moreover, a pass voltage Vpass is applied to the gate terminals of memory cells other than the adjacent isolating memory cell 307 on the source side of program inhibited memory cell 301.

Drawbacks of LSB methodologies shown in FIGS. 2A and 3A as it relates to floating gate (FG)-NAND include: (1) band to band tunneling (BBT) of junction leakage, and (2) punch through (PT) channel leakage. It should be appreciated that BBT of junction leakage is likely to occur, for example, if isolating memory cell 307 is programmed, Vt is approximately three volts and Va3 (voltage at junction a3) is equal to approximately nine volts as shown in FIG. 3B. This is because the junction bias with the gate of isolating memory cell 307 at a negative potential and the drain at a relatively high positive potential (e.g., nine volts etc.) creates an intense electric field that can cause BBT. FIG. 3B shows exemplary voltage characteristics of isolating memory cell 307 (Vth=3.5 v, Vfg=−2 v, Va2=2 v, Va3=9 v and Vg2=0 v) using the aforementioned LSB methodology. Moreover, it should be appreciated that PT channel leakage can occur if isolating memory cell 307 is erased and Vt is less than zero volts for FG-NAND applications because the application of zero volts to the gate of memory cell 307 may not constitute a sufficient application of voltage to turn off the transistor associated with memory cell 307.

As it regards the LSB approach illustrated in FIG. 3A, a lower Vpass voltage may be required. The channel voltage Vch of program inhibited memory cells can be locally boosted to higher values than can be attained using boosting methodologies that do not employ isolation. However, because the local boosted capacitance is very small in such cases, charge is easily leaked. Consequently, the device is very vulnerable to junction leak.

FIG. 4A shows programming conditions for a NAND memory cell string 400 employing a conventional erased area self-boosting (EASB) programming methodology. Referring to FIG. 4A, during programming operations, a programming voltage Vpgm is applied to the gate of program inhibited memory cell 401 and zero volts is applied to the gate of the source side isolating memory cell 407 that is adjacent to program inhibited memory cell 401. Furthermore, a pass voltage Vpass is applied to the gate of the drain side memory cell 409 that is adjacent to program inhibited memory cell 401. It should be appreciated that zero volts is applied to the source select gate 403 and Vcc is applied to the drain select gate 405 of memory cell string 400. As shown in FIG. 4A, memory cells 411 on the drain side of program inhibited memory cell 401 are erased. Moreover, a pass voltage Vpass is applied to the gate terminals of memory cells 411 located on the drain side of program inhibited memory cell 401 and memory cells 413 located on the source side of program inhibited memory cell 401.

Referring again to FIG. 4A, as is shown therein, program inhibited memory cell 401 is isolated only from the source side of the channel rather than from both the source and drain sides as is done in LSB. In EASB, the value of Vpass is related to disturbs as it is in some other conventional boosting methodologies (such as discussed with reference to FIG. 1A). Moreover, in EASB, Vch depends on Vpass much more than it does in LSB. It should be appreciated that EASB generates a lower channel voltage Vch of the program inhibited memory cell 401 overall as compared to LSB, and thus provides smaller (GIDL) gate induced drain leakage and exhibits less variation of Vch.

In addition, as compared to LSB, EASB provides a larger channel capacitance and larger total junction capacitance which provides the memory cell structure with greater protection against junction leakage. Moreover, as compared to LSB, EASB has a boosting voltage that is less dependent on the programming status of memory cells, exhibits lower junction stress and has an efficiency that is less degraded by use of a buffered boosting scheme (see buffering methodologies discussed below with regard to FIGS. 7A and 7B).

FIG. 4B shows typical voltage characteristics of isolating memory cell 407 (Vth=3.5 v, Va2=2 v, Va3=7 v and Vg2=0 v) during programming operations where isolating memory cell 407 is programmed. As shown in FIG. 4B the voltage at junction a3 (which is one of the junctions a1-a16 shown in FIG. 4A) is reduced as compared to LSB and thus "gated diode" or BBT leakage is reduced.

FIG. 5 shows intrinsic capacitances associated with LSB operations upon which quantifications (such as are provided below) of BBT and PT junction leak for conventional LSB operations can be based. FIG. 5 shows gate-source capacitance Cgs, gate-drain capacitance Cgd and body bias capacitance Cdb of transistors that are a part of a memory cell string where LSB is being employed. In the computations provided below, Cgs=Cgd=0.29 fF/um and Cdb=0.12 fF/um at three volts. Referring to FIG. 5, as it regards LSB boosting:

Discharge due to BBT at Vdb=6 v and Vg=0 v for erased memory cell:

$$CV/Ileak=2*(0.29+0.12)fF/um*1V/nA/um=0.81\ uS/1V.$$

Discharge due to PT at Vds=3 v and Vg=0 v for erased memory cell:

$$CV/Ileak=2*(0.29+0.12)fF/um*1V/nA/um=0.81\ uS/1V.$$

It should be appreciated that the above computations are based on Ipt of approximately 1 nA/um and Ibbt of approximately 1 nA/um.

FIG. 6 shows intrinsic capacitances associated with EASB operations upon which quantifications of BBT and PT junction leak for conventional EASB operations (such as are provided below) can be based. FIG. 6 shows gate-source capacitance Cgs, gate-drain capacitance Cgd and body bias capacitance Cdb of transistors that are a part of a memory cell string where EASB is being employed. In the computation provided below, Cgs=Cgd=0.29 fF/um and Cdb=0.12 fF/um at three volts. Referring to FIG. 6, as it regards EASB boosting:

Discharge due to BBT at Vdb=6 v and Vg=0 v for erased memory cell:

$$CV/Ileak=n*(0.29+0.12)fF/um*1V/1\ nA/um=22.4\ uS/1V$$

Discharge due to PT at Vds=3 v and Vg=0 v for erased memory cell:

$$CV/Ileak=n*(0.29*2+0.12)fF/um*1V/1\ nA/um=22.4\ uS/1V$$

It should be appreciated that the above computations are based on an Ipt of approximately 1 nA/um and an Ibbt of approximately 1 nA/um where n is equal to the number of transistors on the drain side of the programmed memory cell (Ileak can be either Ipt or Ibbt). Additionally, where n is larger, the capacity of either of the types of leakage described herein (e.g., BBT or PT) to cause program disturbs is lessened, however, the local boosting value is rendered correspondingly lower.

FIGS. 7A and 7B respectively illustrate conventional EASB and LSB approaches that employ a buffered bias design (e.g., the use of a buffering memory cell). The buffered bias approaches shown in FIGS. 7A and 7B use a buffering memory cell that avoids the leakage problems that are exhibited in typical EASB and LSB approaches where a source side isolating memory cell is used adjacent the program inhibited memory cell. Referring to FIG. 7A, in the EASB case, during programming operations, a programming voltage Vpgm is applied to the gate of program inhibited memory cell 701A and zero volts is applied to the gate of isolating memory cell 706A located on the source side of program inhibited memory cell 701A. In addition, two to four volts is applied to the gate of buffering memory cell 707A that is located adjacent to program inhibited memory cell 701A. Furthermore, a predetermined gate voltage Vg4 is applied to the gate of memory cell 709A and a pass voltage Vpass is applied to the gates of drain side memory cell5 through drain side memory cell15 (see 711A in FIG. 7A) that are adjacent to memory cell 709A. It should be appreciated that Vcc is applied to the source select gate 703A and Vcc is applied to the drain select gate 705A of memory cell string 700A. Referring again to FIG. 7A, memory cells 711A on the drain side of program inhibited memory cell 701A are erased. Moreover, a pass voltage Vpass is applied to the gate terminal of memory cell 704A on the source side of program inhibited memory cell 701A.

Referring to FIG. 7B, in the LSB case, during programming operations, a program voltage Vpgm is applied to the gate of program inhibited memory cell 701B and zero volts is applied to the gates of isolating memory cell 706B and isolating memory cell 709B. In addition, two to four volts is applied to the gate of buffering memory cell 707B that is located adjacent to program inhibited memory cell 701B. Furthermore, a pass voltage Vpass is applied to the gates of the drain side memory cells 5 through 15 (e.g., 711B in FIG. 7B). It should be appreciated that Vcc is applied to the source select gate 703B and to the select drain gate 705B of the memory cell string 700B. Referring again to FIG. 7B, a pass voltage Vpass is applied to the gate terminals of memory cells 711B located on the drain side of program inhibited memory cell 701B and to the gate terminal of memory cell 704B located on the source side of program inhibited memory cell 701B. As is shown in FIG. 7B, memory cells 5 through 15 (e.g., 711B in FIG. 7B) located on the drain side of program inhibited memory cell 701B are erased.

It should be appreciated that the EASB plus buffered bias approach involves the boosting of two channels (memory cell2 and memory cell3). An advantage of the EASB and LSB plus buffered bias approaches of FIGS. 7A and 7B is an alleviation of the "gated diode" or leakage problem described above. A disadvantage of these approaches is a lowering of the boosting efficiency (the capacity to boost based on an applied gate voltage).

FIGS. 8A and 9A illustrate characteristics of the EASB plus buffered bias approach discussed with reference to FIG. 7A with buffering memory cell 707A erased and programmed respectively. Referring to FIG. 8A, when memory cell 707A acts as a buffering memory cell and is erased, BBT is less severe than is the case where buffering is not used. FIGS. 8B and 8C respectively show typical voltage characteristics of isolating memory cell 706A (Vth=3.5 v, Vfg=−2 v, Va2=5 v and Vg1=0 v) and buffering memory cell 707A (Vth=1 v, Vfg=−0.5 v, Va3=7 v and Vg2=4 v), during EASB plus buffered bias operation as illustrated in FIG. 8A. Referring to FIG. 9A, when memory cell 707A acts as a buffering memory cell and is programmed, BBT is less severe than is the case where buffering is not used. FIGS. 9B and 9C respectively, show the characteristics of isolating memory cell 706A (Vth=1 v, Vfg=−0.5 v, Va2=2 v and Vg1=0 v) and buffering memory cell 707A (Vth=3.5 v, Vfg=−2 v, Va2=2 v and Vg2=4 v) during EASB plus buffered bias operation as illustrated in FIG. 9A. FIGS. 8A-9C show that BBT is decreased through the use of buffering whether the buffering memory cell is programmed or erased.

FIGS. 10A-10C show exemplary boosting efficiencies attained using the aforementioned conventional boosting schemes (for Cgs=Cgd=0.29 fF/um and Cdb=0.12 fF/um at 3 volts). Referring to FIG. 10A, an EASB boosting scheme (such as discussed with reference to FIG. 4A) can provide a boost efficiency greater than 80 percent with Vd equal to three volts. Referring to FIG. 10B, an LSB boosting scheme (such as discussed with reference to FIG. 2A) can provide a boost efficiency greater than 70 percent with Vd equal to three volts. Referring to FIG. 10C, a buffered LSB boosting scheme (such as discussed with reference to FIG. 9B) can provide a boost efficiency greater than 61 percent with Vd equal to three volts.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A method for partial local self-boosting of a memory cell channel is disclosed. As a part of partial local self-boosting of a memory cell channel, an isolating memory cell located on a source side of a program inhibited memory cell is turned off and a gating memory cell located on a drain side of the program inhibited memory cell is used to pass a pre-charge voltage to the program inhibited memory cell to provide a pre-charge voltage to a channel of the program inhibited memory cell. Moreover, a pre-charge voltage is passed to a buffering memory cell located on the source side of the program inhibited memory cell to provide a pre-charge voltage to a channel of the buffering memory cell and the gating memory cell that is located on the drain side of the program inhibited memory cell is turned off. During programming, a programming voltage is applied to the gate of the program inhibited memory cell where a channel voltage of the program inhibited memory cell is raised above a level raised by the pre-charge voltage.

BRIEF DESCRIPTION OF THE DRAWINGS

The accompanying drawings, which are incorporated in and form a part of this specification, illustrate embodiments and, together with the description, serve to explain the principles of the embodiments.

The drawings referred to in this description should not be understood as being drawn to scale except if specifically noted.

DETAILED DESCRIPTION

Reference will now be made in detail to various embodiments, examples of which are illustrated in the accompanying drawings. While descriptions will be provided in conjunction with these embodiments, it will be understood that the descriptions are not intended to limit the scope of the embodiments. On the contrary, the disclosure is intended to cover alternatives, modifications and equivalents, of these embodiments. Furthermore, in the following description, numerous specific details are set forth in order to provide a thorough understanding of embodiments. In other instances, well-known methods, procedures, components, and circuits have not been described in detail as not to unnecessarily obscure aspects of embodiments.

As used herein the term "program inhibited memory cell" is intended to refer to a memory cell that shares a word line with a memory cell to be programmed whose channel voltage is boosted in order to prevent program disturbs. Moreover, as used herein the term "buffering memory cell" is intended to refer to a memory cell located adjacent the program inhibited memory cell between the program inhibited memory cell and an isolating memory cell on the source side of the associated memory cell string. In addition, as used herein the term "isolating memory cell" is intended to refer to a memory cell located adjacent the buffering memory cell that isolates the buffering memory cell and the program inhibited memory cell from memory cells located on the source side of the memory cell string. As used herein the term "gating memory cell" is intended to refer a memory cell located on the drain side of the program inhibited memory cell that enables pre-charge voltage to be supplied to the program inhibited memory cell channel. As used herein the term "program inhibited memory cell channel" is intended to refer to the channel that extends between the isolating memory cell and the gating memory cell.

Figure 1:
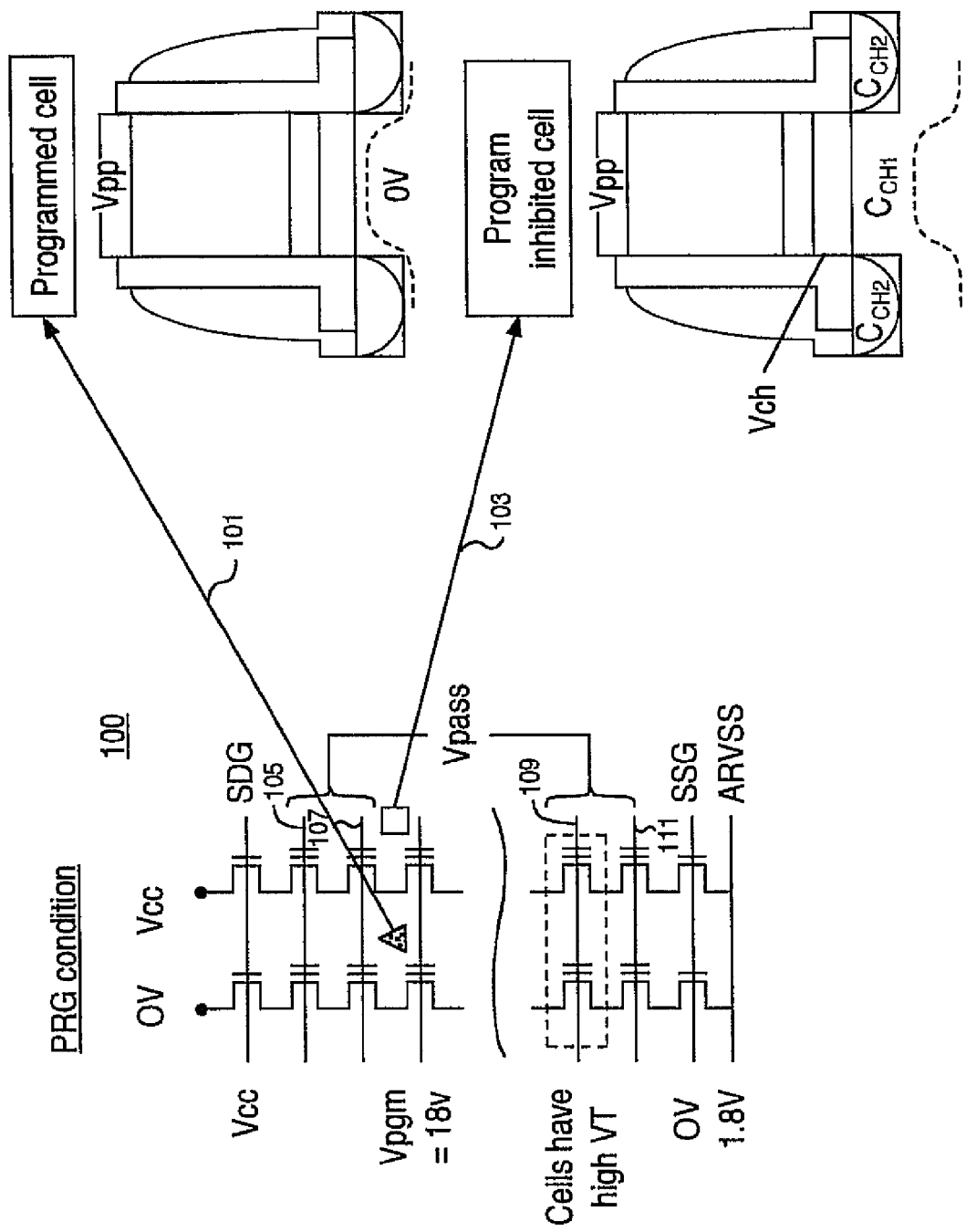
FIG. 1 shows the programming conditions for programming a memory cell of a conventional NAND memory cell string.
Figure 2A:
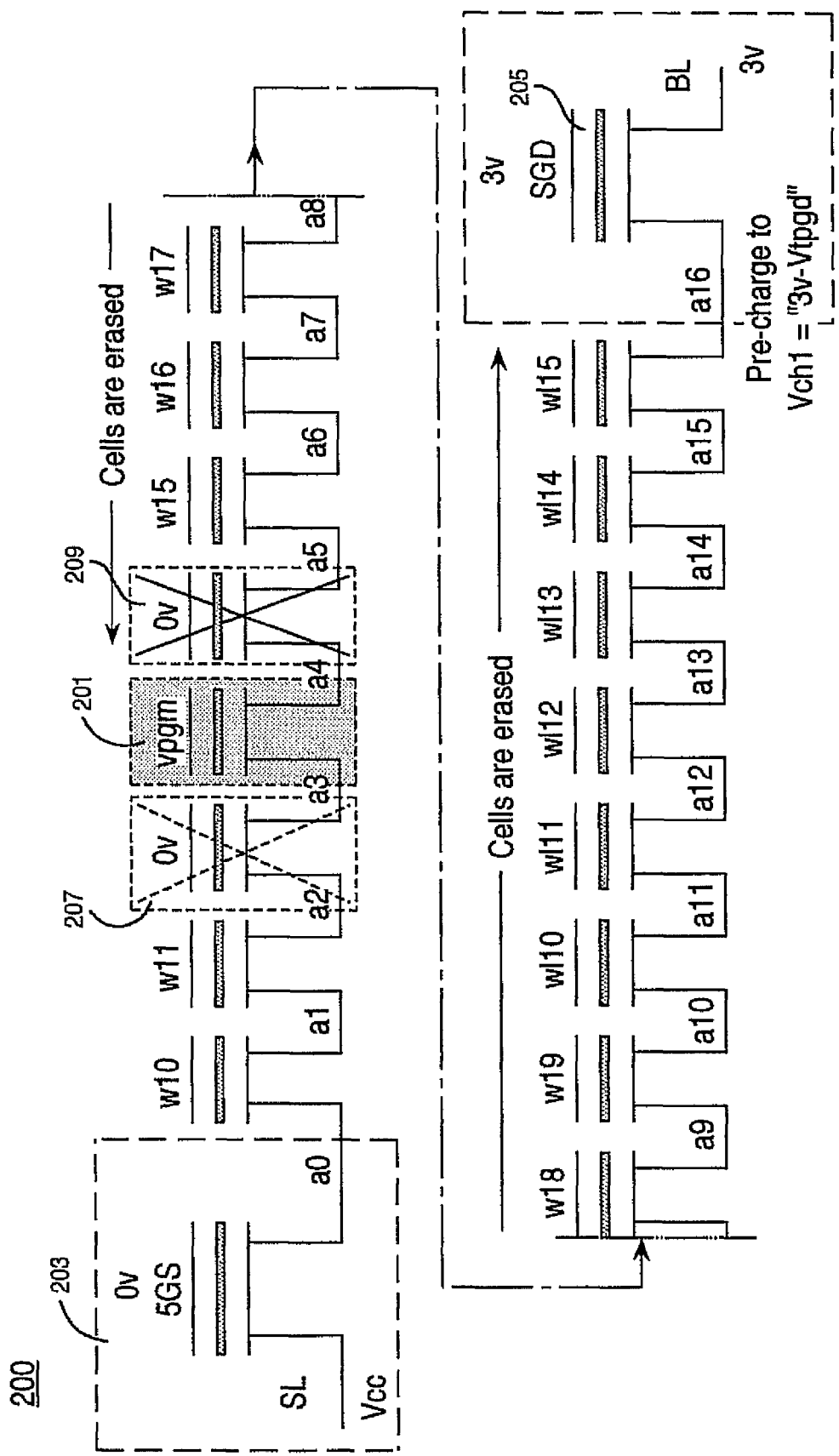
FIG. 2A shows programming conditions for a memory cell string employing a conventional local self-boosting (LSB) programming methodology.
Figure 2C:
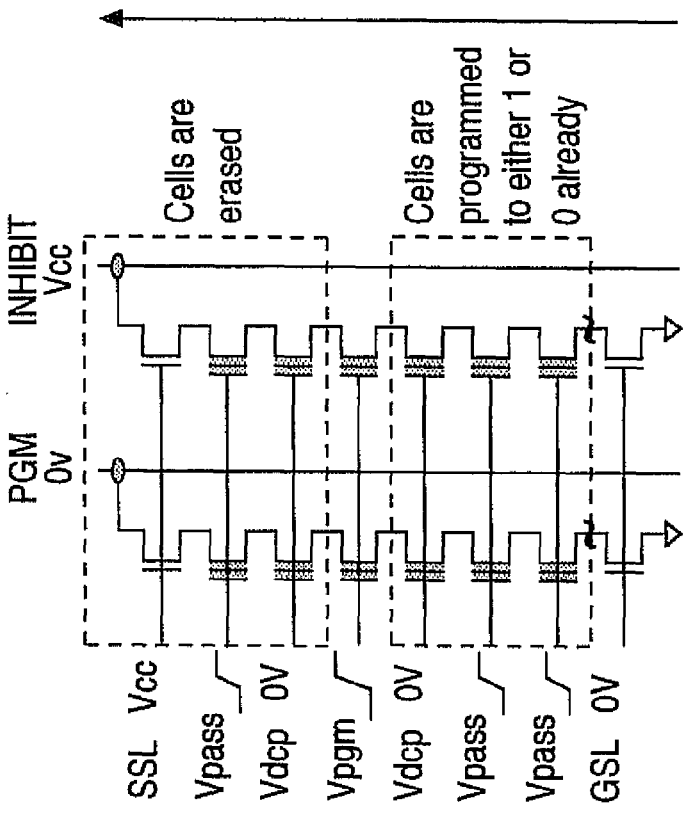
FIG. 2C shows a conventional LSB methodology where memory cells on the drain side of a program inhibited memory cell are erased and memory cells on the source side of the program inhibited memory cell are programmed to either one or zero.
Figure 2B:
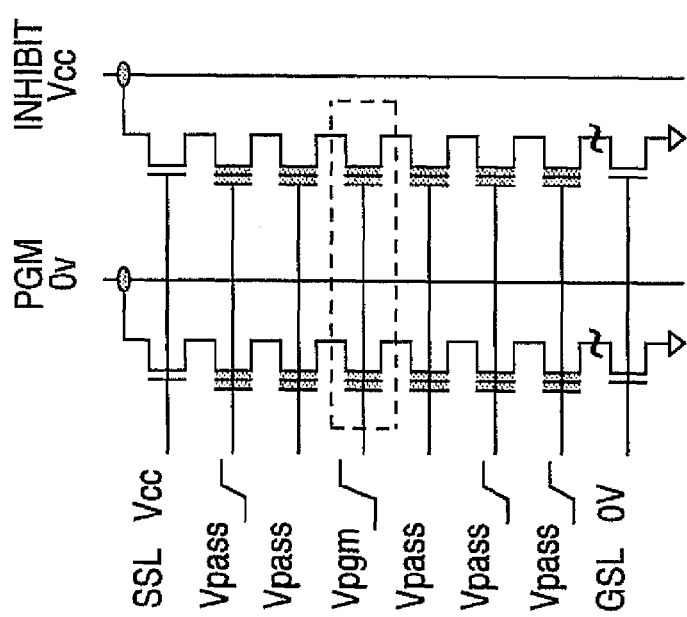
FIG. 2B shows a conventional LSB methodology where memory cells on the drain and source sides of the program inhibited memory cell may not be erased and memory cells on the drain and source sides of the program inhibited memory cell have a pass voltage Vpass applied to their gates.
Figure 3A:
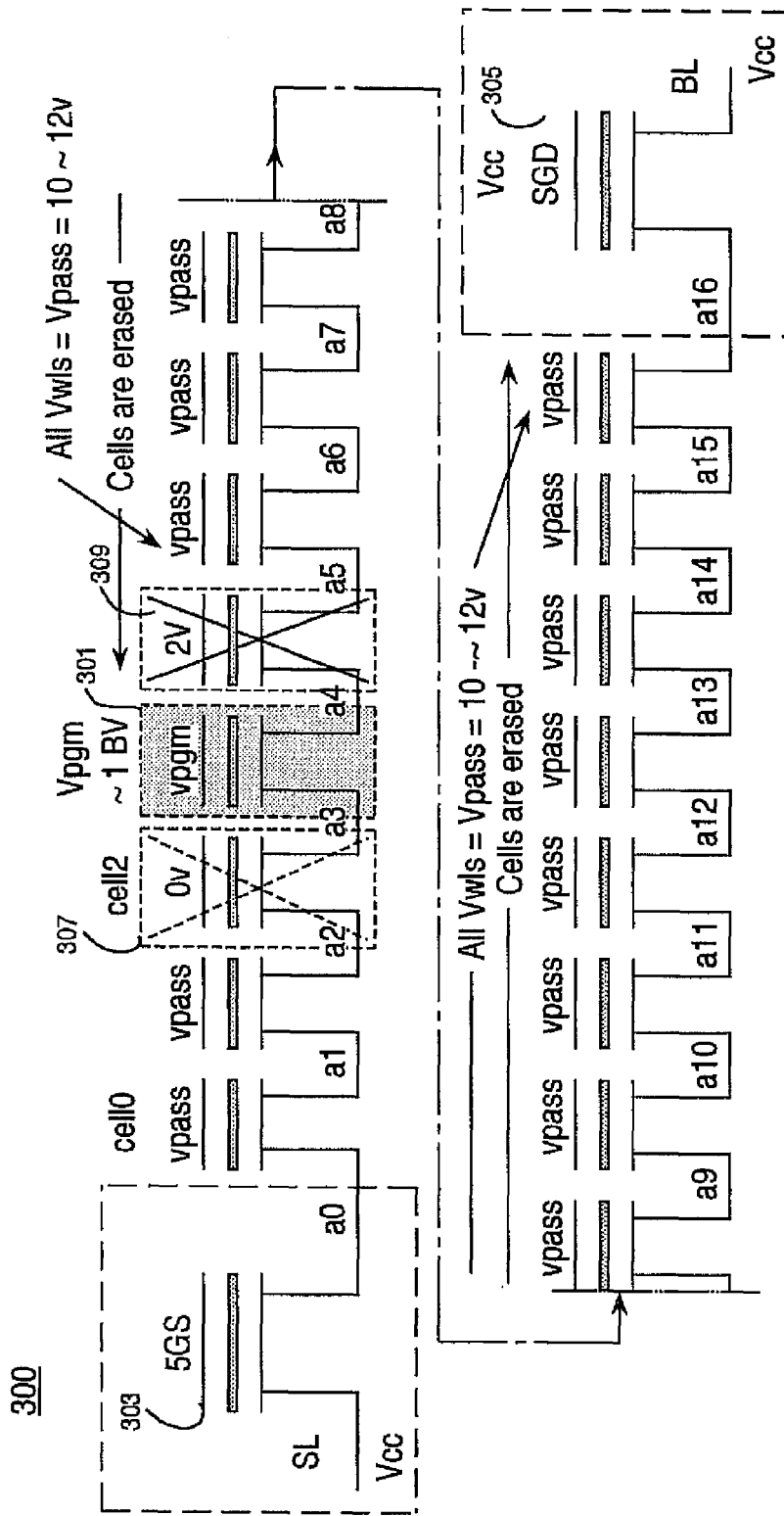
FIG. 3A shows programming conditions for a NAND memory cell string employing a conventional LSB programming methodology.
Figure 3B:
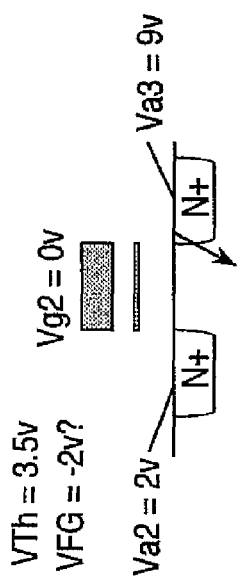
FIG. 3B shows characteristics of a programmed isolating memory cell that is located adjacent a program inhibited memory cell during LSB operations such as are illustrated in FIG. 3A.
Figure 4A:
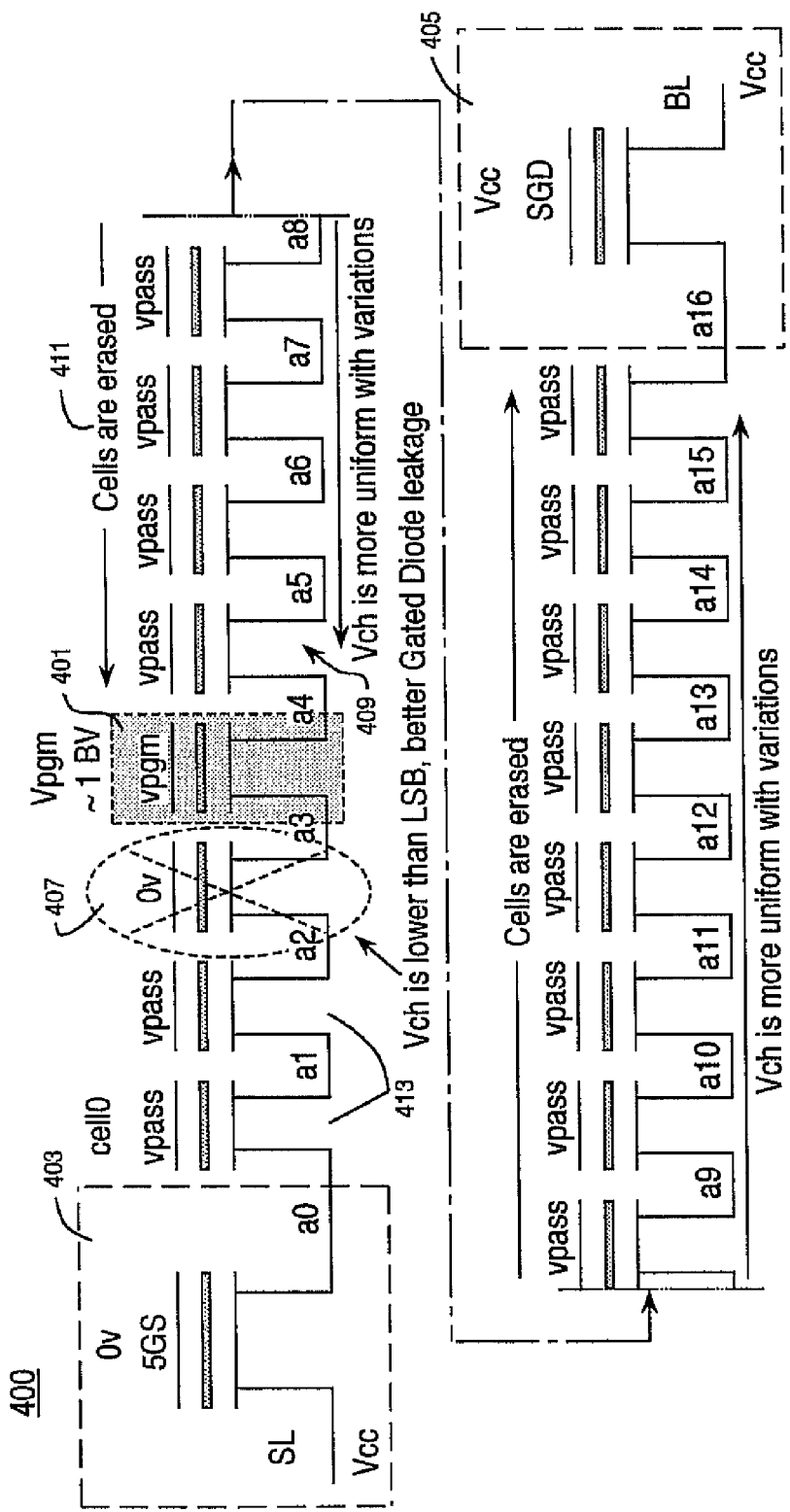
FIG. 4A shows programming conditions for a NAND memory cell string employing a conventional erased area self-boosting (EASB) programming methodology.
Figure 4B:
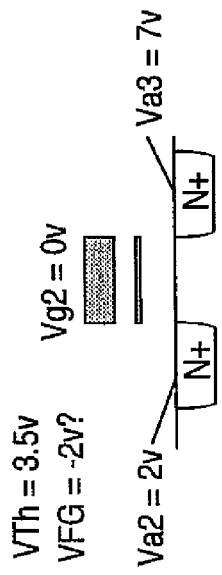
FIG. 4B shows characteristics of a programmed isolating memory cell that is located adjacent a program inhibited memory cell during EASB operations such as are illustrated in FIG. 4A.
Figure 5:
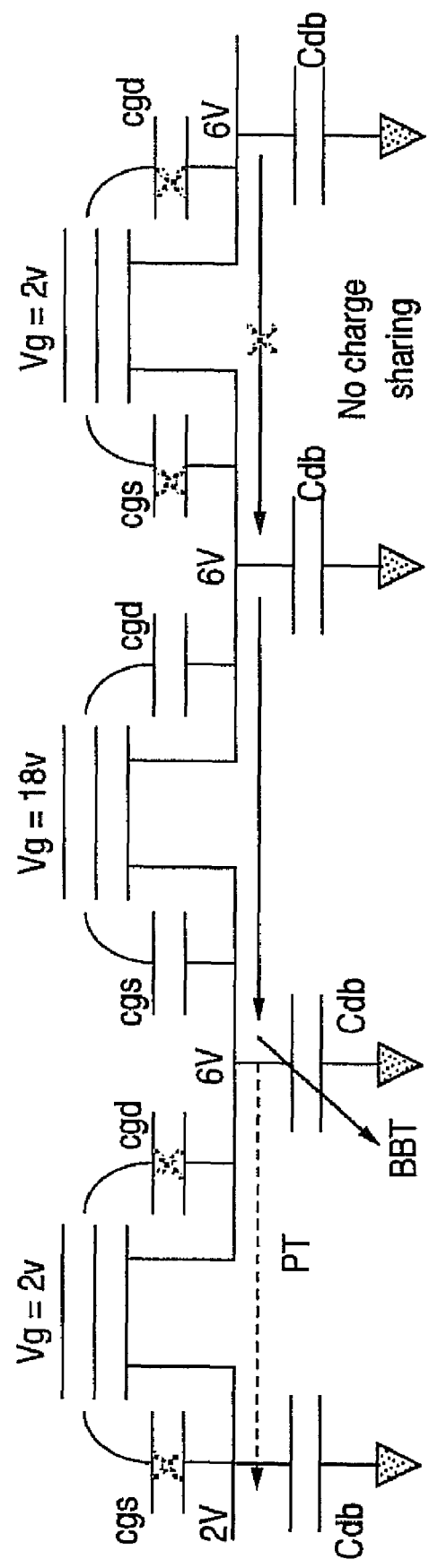
FIG. 5 shows intrinsic capacitances associated with LSB operations upon which quantifications of band to band tunneling (BBT) and punch through (PT) junction leak for conventional LSB operations can be based.
Figure 6:
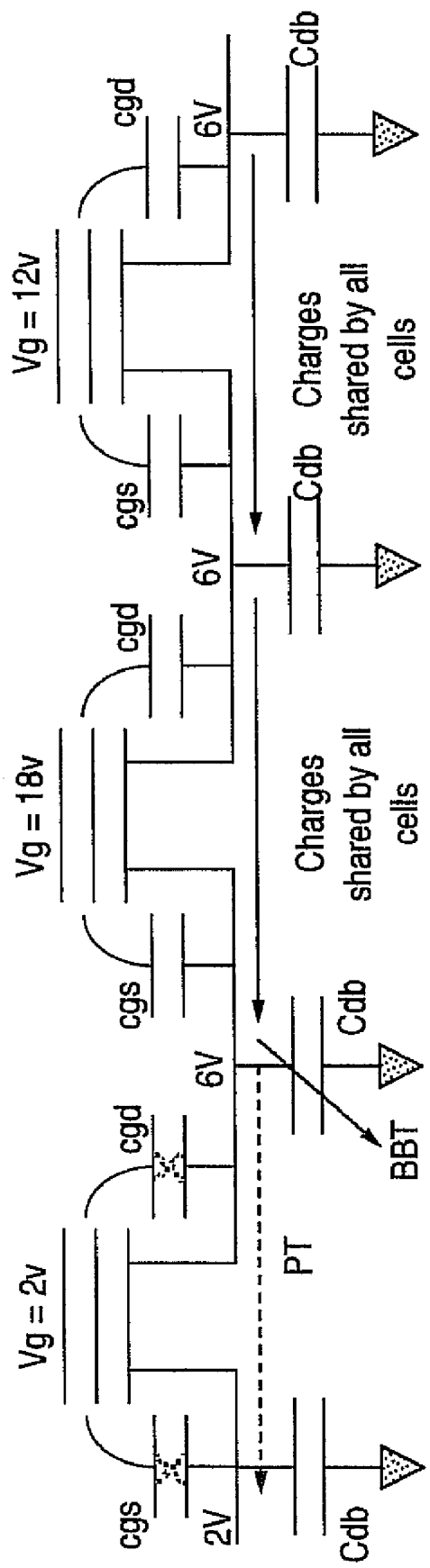
FIG. 6 shows intrinsic capacitances associated with EASB operations upon which quantifications of BBT and punch through PT junction leak for conventional EASB operations can be based.
Figure 7A:
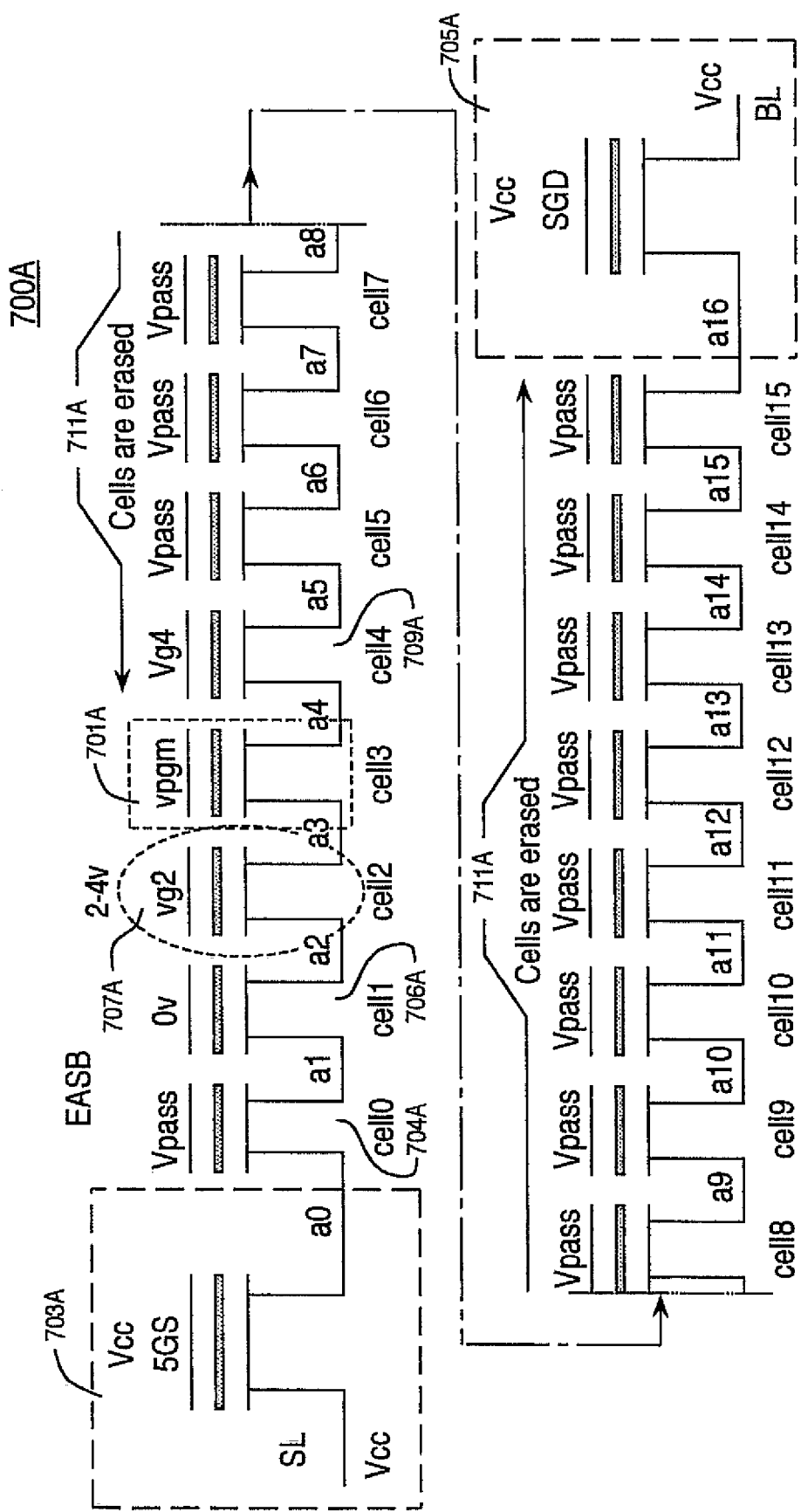
FIG. 7A illustrates a conventional EASB methodology that uses a buffering memory cell.
Figure 7B:
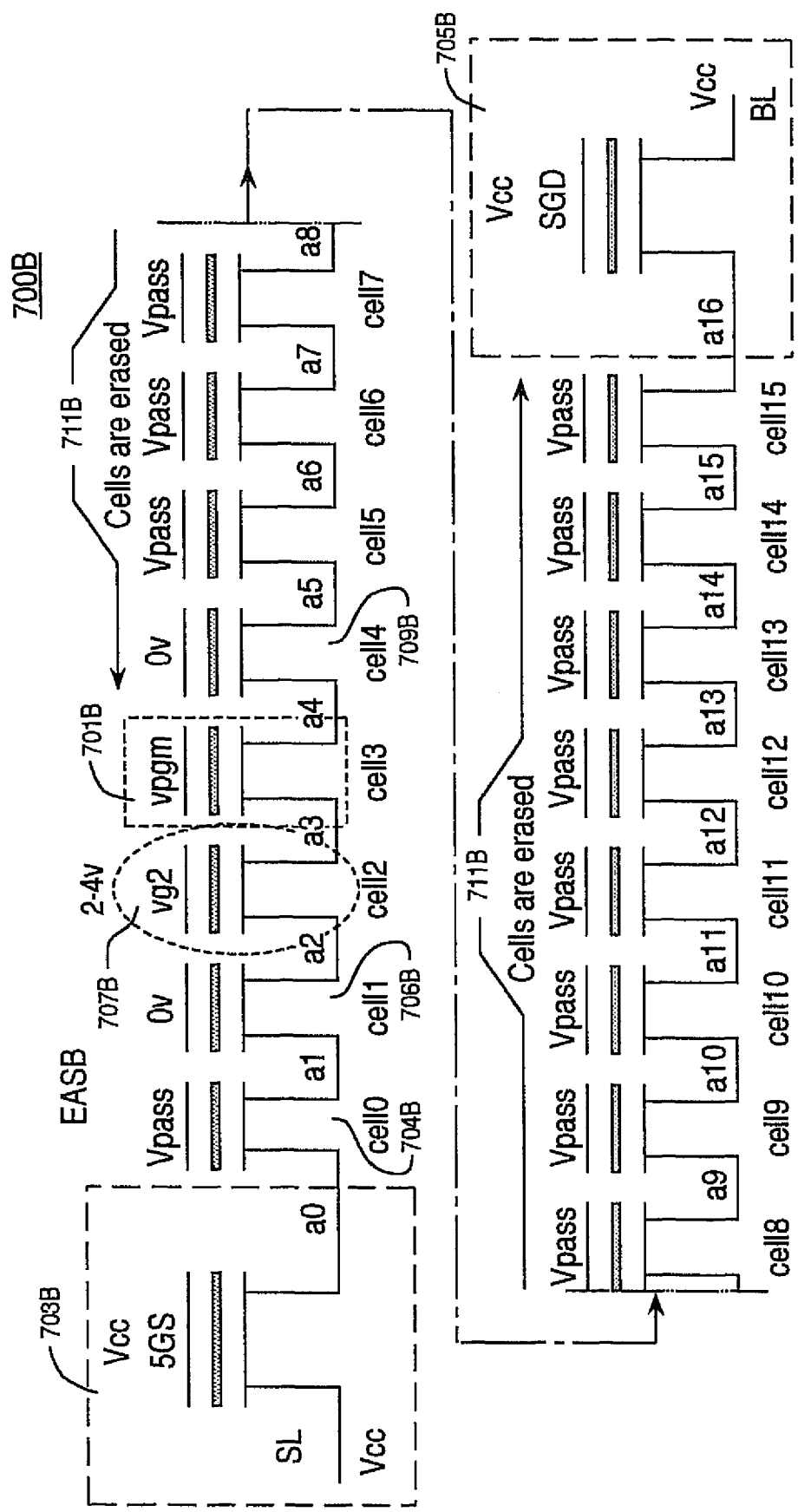
FIG. 7B illustrates a conventional LSB methodology that uses a buffering memory cell.
Figure 8A:
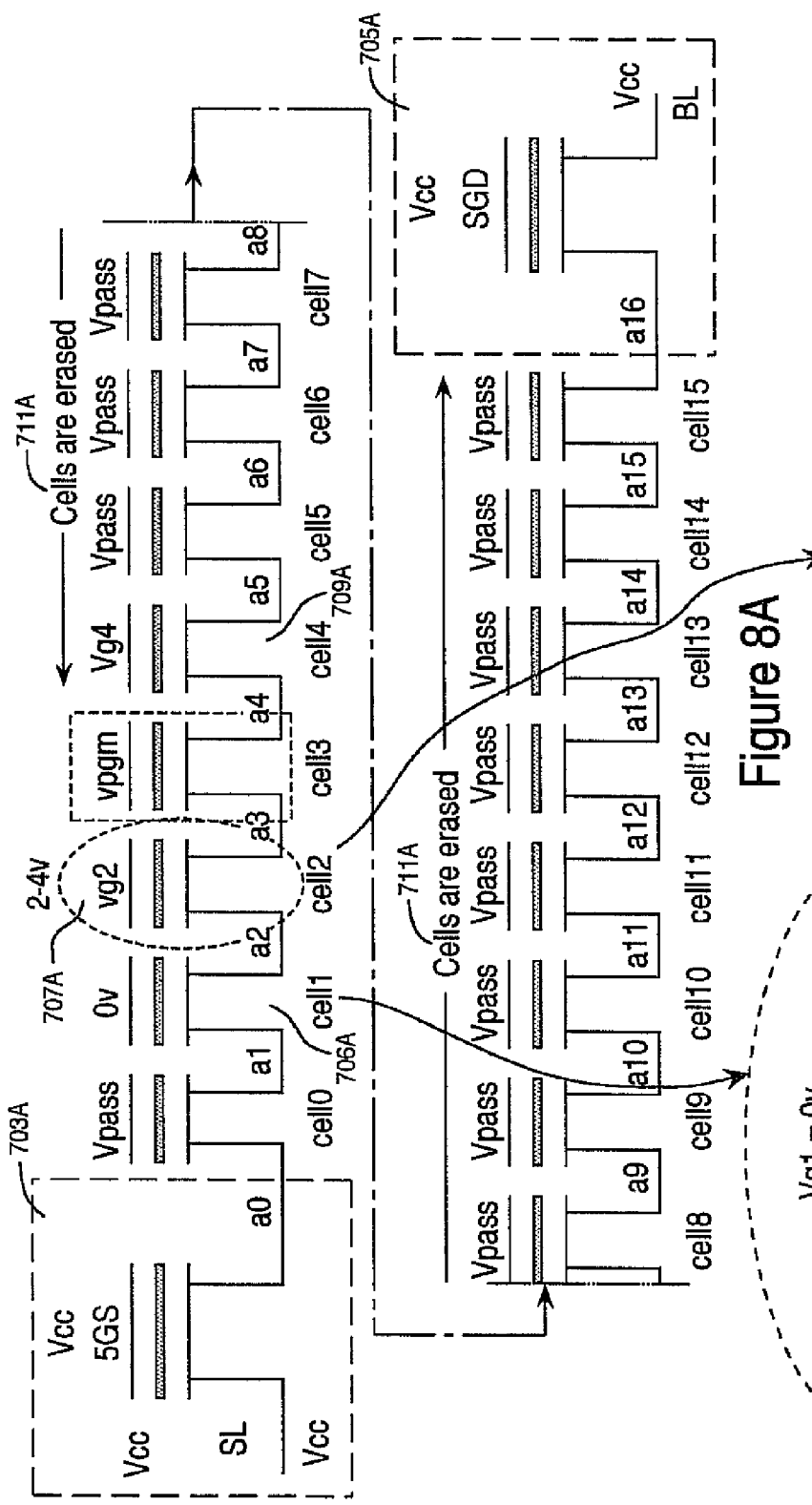
FIG. 8A illustrates a conventional EASB plus buffered bias methodology where the buffering memory cell is erased.
Figure 8C:
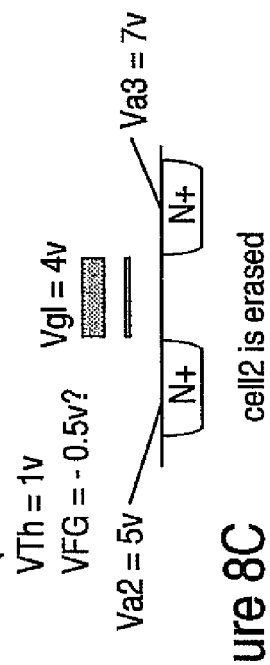
FIG. 8C shows the characteristics of the buffering memory cell during the EASB operations illustrated in FIG. 8A.
Figure 8B:
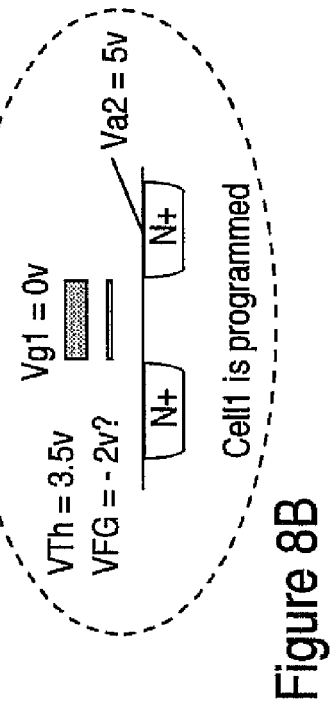
FIG. 8B shows the characteristics of the isolating memory cell during the EASB operations illustrated in FIG. 8A.
Figures 9A, 9B, 9C:
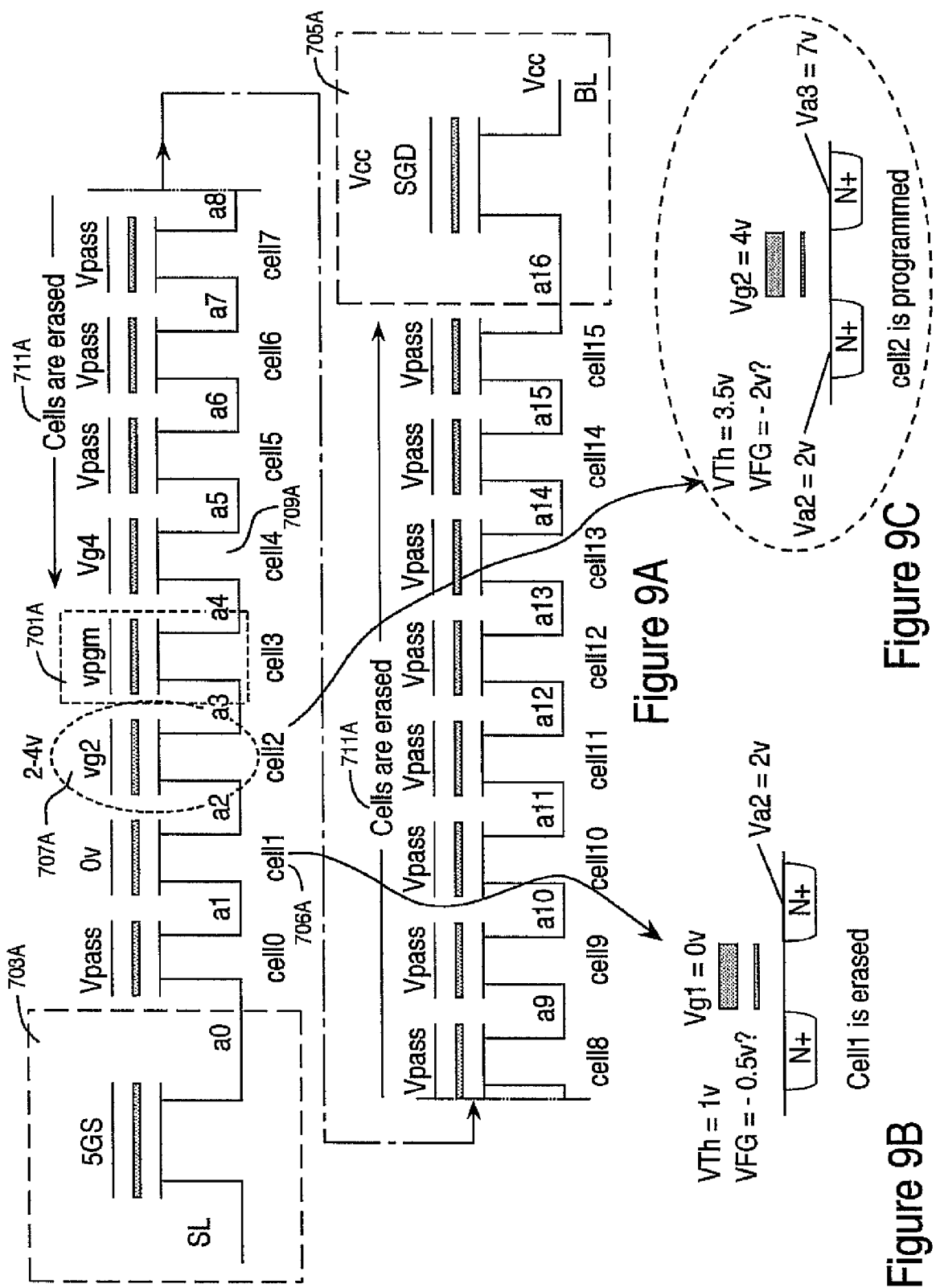
FIG. 9A illustrates a conventional EASB plus buffered bias methodology where the buffering memory cell is programmed.
FIG. 9B show the characteristics of the isolating memory cell during the EASB operations illustrated in FIG. 9A.
FIG. 9C show the characteristics of the buffering memory cell during the EASB operations illustrated in FIG. 9A.
Figure 10A:
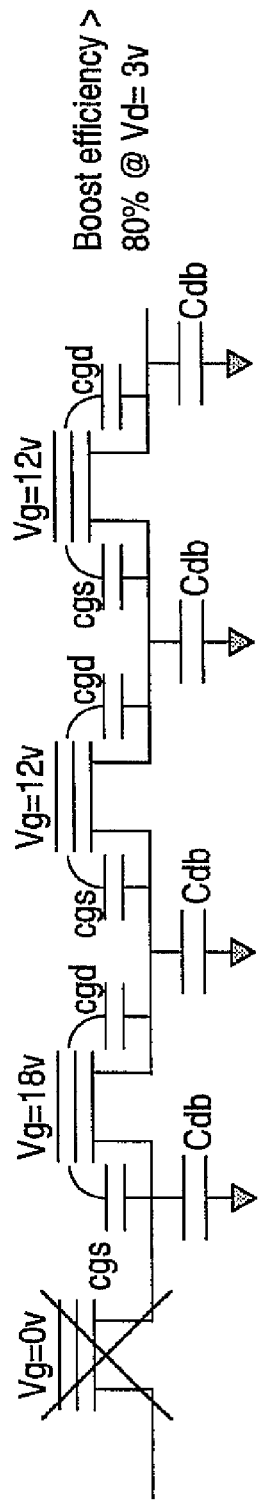
FIG. 10A shows an exemplary boosting efficiency attained using a conventional EASB boosting methodology.
Figure 10B:
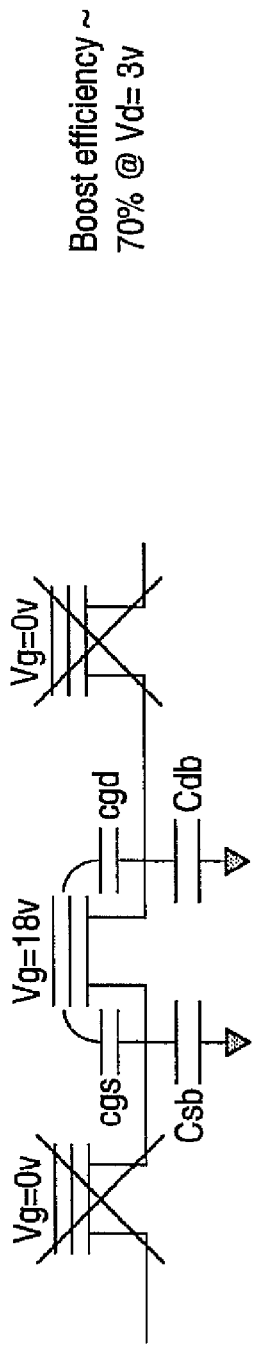
FIG. 10B shows an exemplary boosting efficiency attained using a conventional LSB boosting methodology.
Figure 10C:
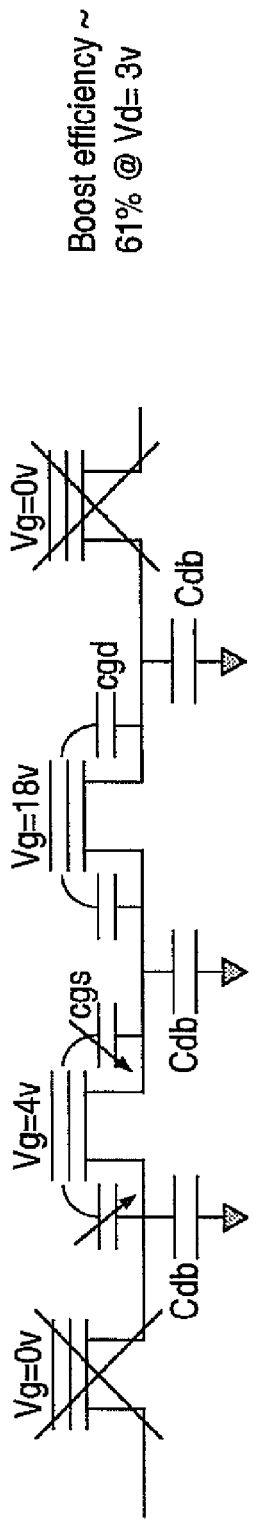
FIG. 10C shows an exemplary boosting efficiency attained using a conventional buffered LSB boosting methodology.
Figure 11A:
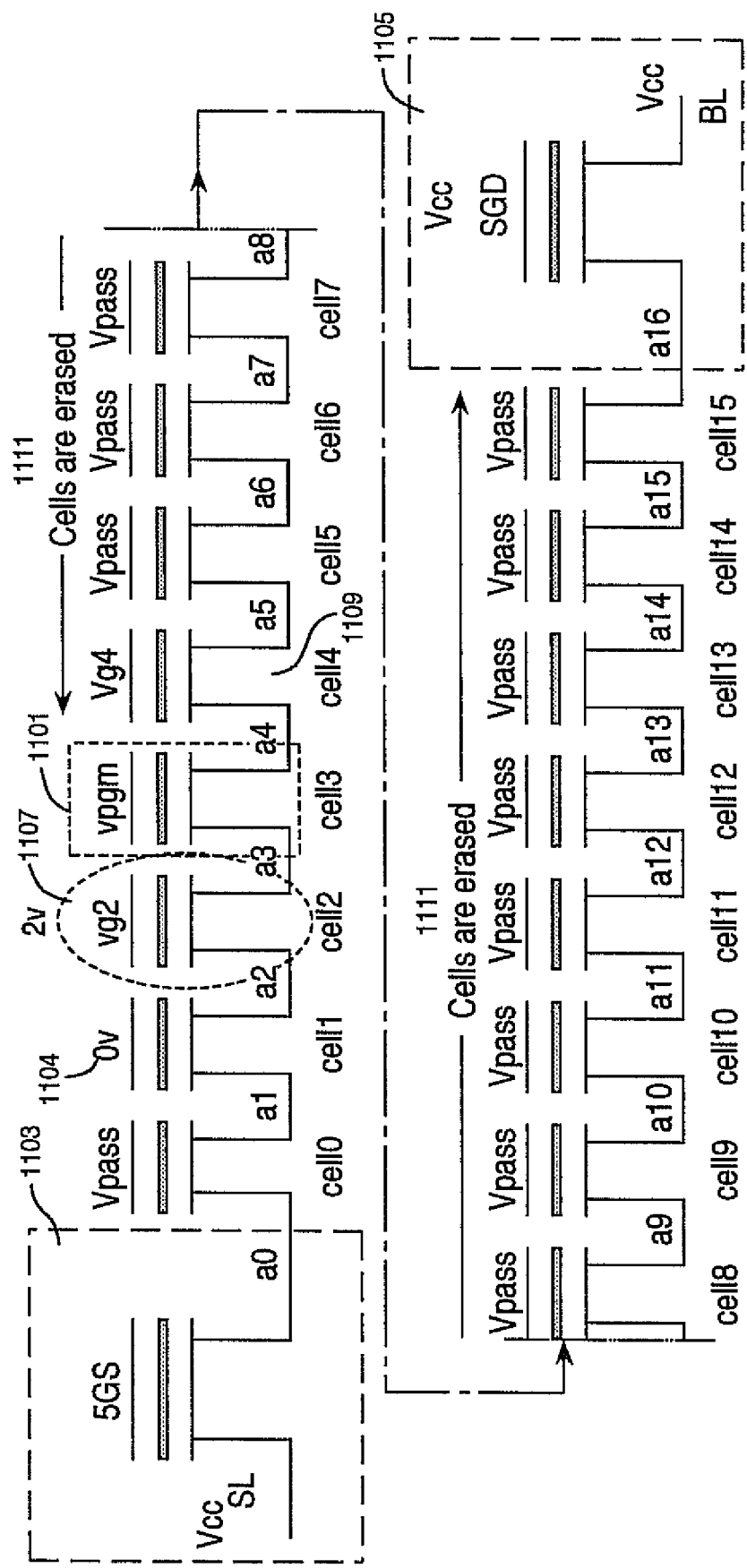
FIG. 11A shows a memory cell string that includes a program inhibited memory cell where partial LSB with pre-charging is used according to one embodiment.

Exemplary Partial Local Self-Boosting of a Memory Cell Channel According to Embodiments FIG. 11A shows a memory cell string 1100 that includes a program inhibited memory cell where partial local self-boosting (LSB) with pre-charging is used according to one embodiment. In one embodiment, partial local self-boosting of the channel of the program inhibited memory cell is effected through the application of a pre-charge voltage. FIG. 11A shows memory cells 0-15 that include program inhibited memory cell 1101, isolating memory cell 1104, buffering memory cell 1107, gating memory cell 1109 and erased memory cells 1111 (memory cells 4-15). In addition, FIG. 11A shows source select gate 1103 and drain select gate 1105. Also shown in FIG. 11B are voltages (e.g., Vpass, Vg2, Vpgm, Vg4 and Vcc) that are applied to the gates of designated memory cells and select transistors.

Referring to FIG. 11A, during programming, the gate of program inhibited memory cell 1101 (e.g., memory cell3) receives the same programming voltage Vpgm that is applied to a memory cell that is being programmed. In addition, memory cells 0 and 5-15 have a pass voltage Vpass applied to their gates. In one embodiment, isolating memory cell 1104 (e.g., memory cell1) has a voltage of zero volts applied to its gate. In one embodiment, because the channel of program inhibited memory cell 1101 (memory cell3) is provided with a pre-charge voltage, the charge in the channel of program inhibited memory cell 1101 is raised just before the application of the aforementioned programming voltage Vpgm is applied to the gate of program inhibited memory cell 1101. Thereafter, when the program voltage Vpgm is applied to the gate of program inhibited memory cell 1101, charge in addition to that provided in the aforementioned pre-charge phase is provided to the channel of program inhibited memory cell 1101. It should be appreciated that the level of charge provided to the channel of program inhibited memory cell 1101 that is due to the combination of the pre-charge voltage and the program voltage results in more effective program disturb prevention as compared to conventional channel boosting methodologies.

Figure 11B:
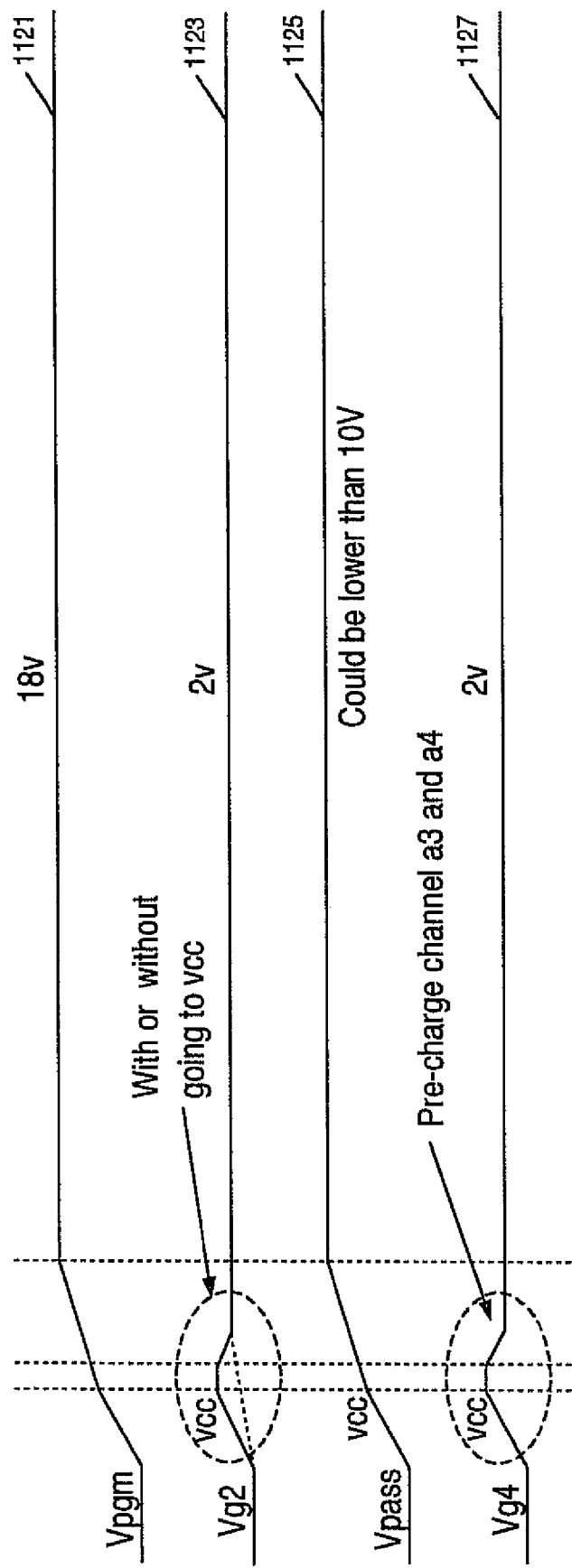
FIG. 11B shows a graph of voltages that are associated with partial LSB with pre-charging according to one embodiment.

FIG. 11B shows a graph of voltages that are a part of the above discussed pre-charge and programming operations according to one embodiment. FIG. 11B shows graphs for: (1) the programming voltage Vpgm, that is applied to the gate of program inhibited memory cell 1121, (2) the gate voltage Vg2 applied to the gate of isolating memory cell 1123, (3) the pass transistor voltage Vpass applied to the gates of memory cells 0 and 5-15 1125, and (4) the gate voltage Vg4 applied to gating memory cell 1127.

Referring to FIG. 11B, before the application of the full programming voltage Vpgm (e.g., 18 volts etc.), the gate voltage of buffering memory cell 1107 and the gate voltage of gating memory cell 1109 are raised to allow pre-charge voltage to pass to the channels of program inhibited memory cell 1101 and buffering memory cell 1107. These voltages are then lowered resulting in the turn off of gating memory cell 1109. In one embodiment, the isolated channel is not limited to the channels of buffering memory cell 1107 and program inhibited memory cell 1101 but can also encompass the channels of other memory cells on the drain side of program inhibited memory cell 1101 (based on which memory cell is used as the gating memory cell). For example, instead of employing memory cell 4 as the gating memory cell and raising the gate voltage Vg4 of memory cell4 (e.g., 1109) to six volts as shown in FIG. 11A, the gate voltage Vg7 of memory cell7 can be raised to six volts while Vg4-Vg6 and Vg8-Vg15 are raised to Vpass. In this example, memory cell7 would act as the gating memory cell and the total "program inhibited memory cell channel" would include the six channels of memory cells 3-7 (the voltage of the six channels can be averaged to determine the program inhibited memory cell channel voltage). In one embodiment, any of the memory cells located on the drain side of program inhibited memory cell 1101 can act as the gating memory cell. It should be appreciated that the lengthening of the program inhibited memory cell channel in this manner makes leakage less of a concern.

In an alternate embodiment, the gate voltage of buffering memory cell 1107 can be raised high enough to allow the passing of a pre-charge voltage to buffering memory cell 1107 before it is lowered to turn off buffering memory cell 1107. Consequently, although buffering memory cell is turned off, the aforementioned passing of charge to it's channel allows this charge to contribute to the boosting of the voltage in the program inhibited channel.

Figure 12A:
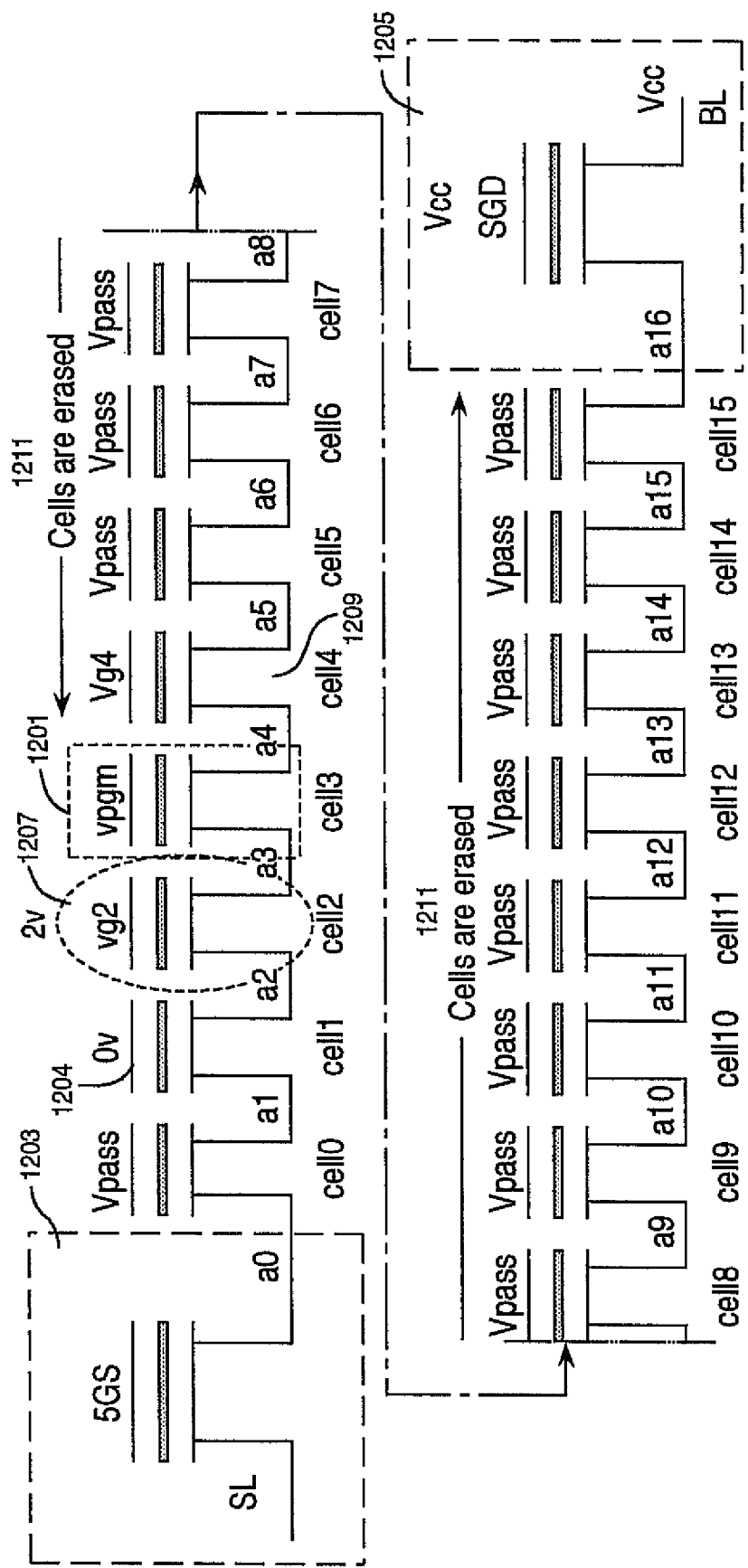
FIG. 12A shows a memory cell string that includes a program inhibited memory cell where partial LSB with pre-charging is used according to another embodiment.

FIG. 12A shows a memory cell string 1200 that includes a program inhibited memory cell where partial local self-boosting (LSB) with pre-charging is used according to another embodiment. In one embodiment, partial local self-boosting of the channel of the program inhibited memory cell is effected through the passing of a pre-charge voltage to the channel of the program inhibited memory cell. FIG. 12A shows memory cells 0-15 that include program inhibited memory cell 1201, isolating memory cell 1204, buffering memory cell 1207, gating memory cell 1209 and erased memory cells 1211 (memory cells 4-15). In addition, FIG. 12A shows source select gate 1203 and drain select gate 1205. Also shown in FIG. 12B are voltages (e.g., Vpass, Vg2, Vpgm, Vg4 and Vcc) that are applied to the gates of designated memory cells and the source select transistor.

Referring to FIG. 12A, during programming, the same programming voltage Vpgm that is applied to the gate of the memory cell that is being programmed is applied to the gate of program inhibited memory cell 1201. In addition, a pass voltage Vpass is applied to the gates of memory cells 0 and 5-15. In one embodiment, isolating memory cell 1204 has a voltage of 0 volts applied to its gate. In one embodiment, because a pre-charge voltage is passed to the channel of program inhibited memory cell 1201, the charge in the channel of program inhibited memory cell 1201 is raised just before the application of the aforementioned programming voltage Vpgm to the gate of program inhibited memory cell 1201. Thereafter, when the programming voltage Vpgm is applied to the gate of program inhibited memory cell 1201, charge in addition to that provided in the aforementioned pre-charge phase, that is attributable to programming voltage Vpgm is provided to the channel of program inhibited memory cell 1201. It should be appreciated that the level of charge provided to the channel of the program inhibited memory cell 1201 that is due to the combination of the pre-charge voltage and the programming voltage Vpgm results in more effective program disturb prevention as compared to conventional channel boosting methodologies.

Figure 12B:
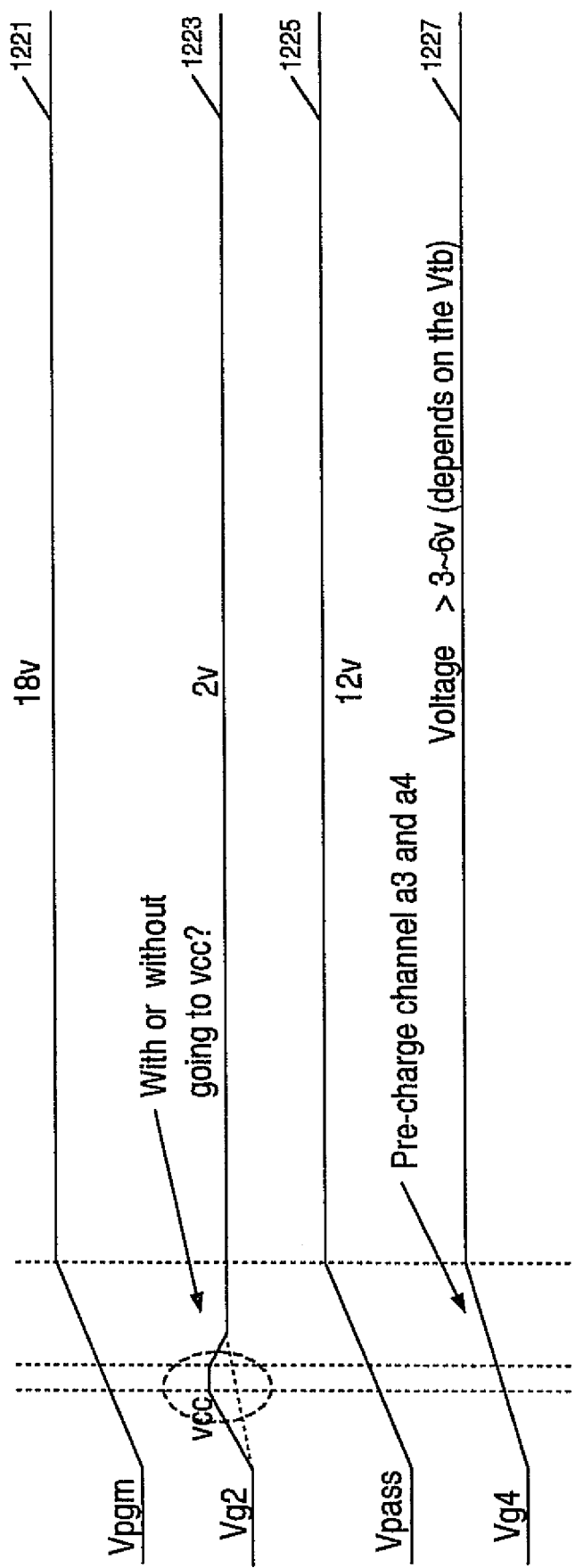
FIG. 12B shows a graph of voltages that are associated with partial LSB with pre-charging according to one embodiment.

FIG. 12B shows a graph of voltages that are a part of the pre-charge and programming operations discussed with reference to FIG. 12A according to one embodiment. FIG. 12B shows graphs for: (1) the programming voltage Vpgm 1221, (2) the voltage Vg2 applied to the buffering memory cell 1223, (3) the pass transistor voltage Vpass 1225, and (4) the voltage Vg4 applied to the gate of gating memory cell 1227.

Referring to FIG. 12B, initially Vg4 is raised such that a pre-charge voltage is passed to program inhibited memory cell 1201. It should be appreciated that the voltage applied to the gate Vg4 of gating memory cell 1209 isolates program inhibited memory cell 1201 from other cells when a4 rises higher than a certain voltage and is maintained at that voltage. In one embodiment, the certain voltage can be six volts. In another embodiment, the certain voltage can be a voltage other than six volts. It should be appreciated that if there is a leak and the voltage at a4 falls then gating memory cell 1209 allows charge to be passed from a5 to a4. In one embodiment, the isolated channel is not limited to the channels associated with buffering memory cell 1207 and program inhibited memory cell 1201 and can be extended to any memory cell that depends on Ileak.

Exemplary embodiments provide the benefits of conventional systems without their drawbacks. For example, in exemplary embodiments that employ mirror bit NAND (MB-NAND) architecture, (PT) punch through leakage is less a concern than with conventional systems. Moreover, with buffered LSB approaches band to band tunneling (BBT) is less a concern. Exemplary embodiments increase the channel voltage of program inhibited memory cells by pre-charging the program inhibited memory cells (e.g., 1101 in FIG. 11A and 1201 in FIG. 12A) in a pre-charge phase. In one embodiment, as discussed above, this can be accomplished by applying various voltages to the gate of memory cells on the drain side of the program inhibited memory cell. In one embodiment, the gating memory cell can be varied (such as to reduce susceptibility to leakage).

Figure 13:
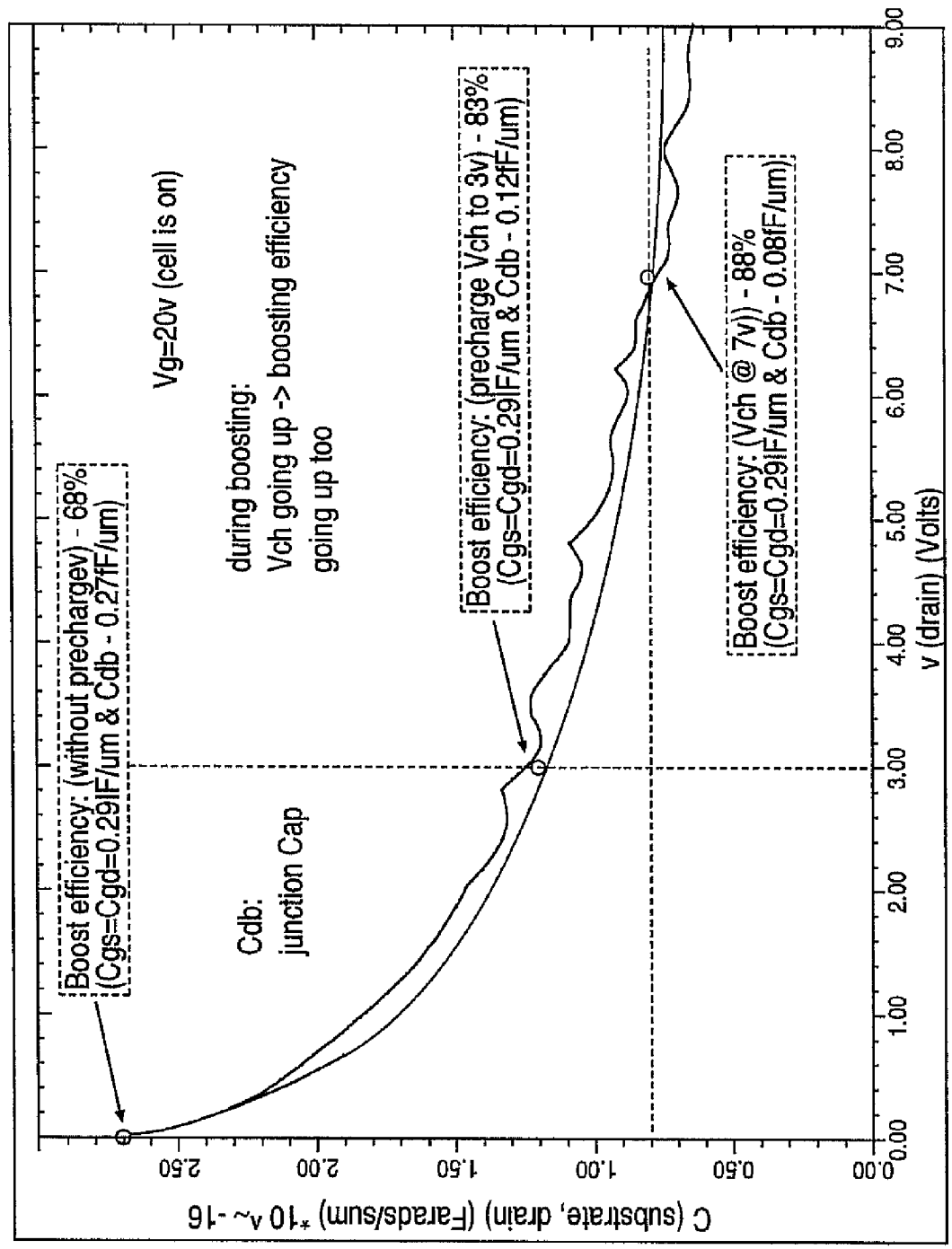
FIG. 13 shows a graph that illustrates exemplary boost efficiencies for various conditions of the program inhibited channel when a partial LSB approach such as is discussed with reference to FIGS. 11A-12B is employed according to one embodiment.

FIG. 13 shows a graph that illustrates exemplary boost efficiencies for various conditions of the program inhibited channel when a partial LSB approach such as is discussed with reference to FIGS. 11A-12B is employed according to one embodiment. FIG. 13 shows that the boost efficiency without a pre-charge phase is approximately 68 percent (Cgs=Cgd=0.29 fF/um and Cdb approximately 0.27 fF/um). However, the boost efficiency when the program inhibited channel is pre-charged to three volts is approximately 83 percent (Cgs=Cgd=0.29 fF/um and Cdb approximately 0.12 fF/um). Furthermore, the boost efficiency when the channel voltage Vch is seven volts is approximately 88 percent (Cgs=Cgd=0.29 fF/um and Cdb approximately 0.08 fF/um). It should be appreciated that FIG. 13 shows that boost efficiency is increased by the use of pre-charge operations when a partial LSB approach is employed.

Figure 14:
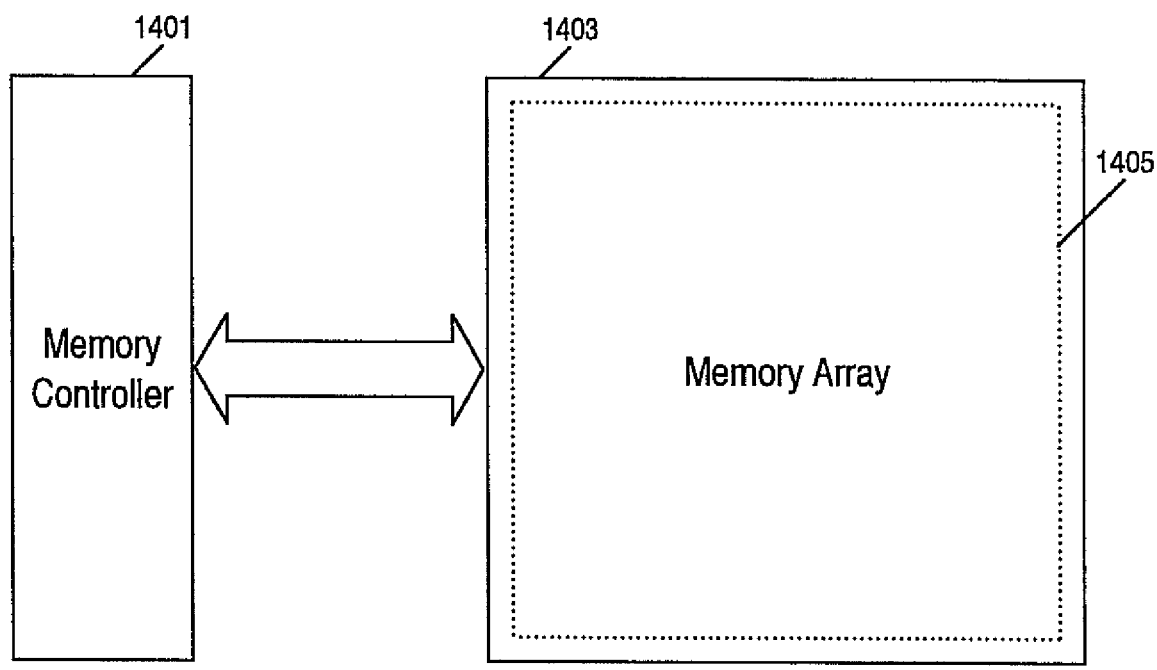
FIG. 14 shows an exemplary operating environment of a NAND flash memory array that uses a partial LSB approach to programming memory cells that includes the pre-charging of a program inhibited channel of a NAND memory cell string according to one embodiment.

FIG. 14 shows an exemplary operating environment 1400 of a NAND memory array that uses a partial LSB approach to programming memory cells that includes the pre-charging of a program inhibited channel of a NAND memory cell string according to one embodiment. FIG. 14 shows memory controller 1401 and memory array 1403 which includes NAND memory cell strings such as those discussed with reference to FIGS. 11A-12B. Referring to FIG. 14, memory controller 1401 controls data going to and from memory array 1403. Moreover, programming of the memory cells that are located in memory array 1403 are performed utilizing the partial LSB processes described in detail herein.

Figure 15:
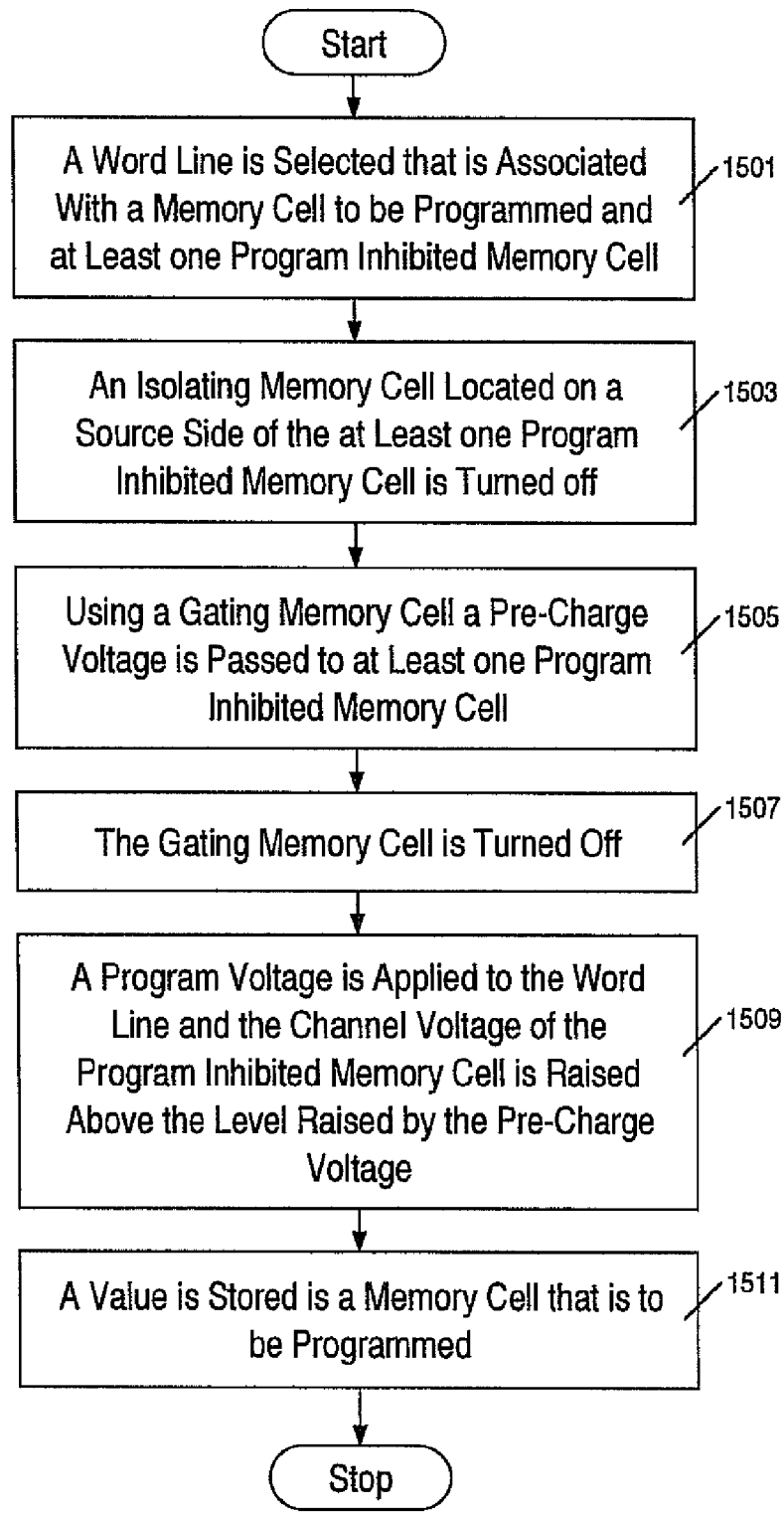
FIG. 15 shows a flowchart of the steps performed in a method for programming using partial LSB of a memory cell channel according to one embodiment.

Exemplary Operations of Method for Partial Local Self-Boosting of a Memory Cell Channel According to Embodiments FIG. 15 shows a flowchart 1500 of the steps performed in a method for programming using partial local self-boosting (LSB) of a memory cell channel according to one embodiment. Although specific steps are disclosed in the flowcharts, such steps are exemplary. That is the present invention is well suited to performing various other steps or variations of the steps recited in the flowcharts.

Referring to FIG. 15, at step 1501, a word line is selected that is associated with a memory cell to be programmed and at least one program inhibited memory cell.

At step 1503, an isolating memory cell located on a source side of the at least one program inhibited memory cell is turned off.

At step 1505, using a gating memory cell located on a drain side of the at least one program inhibited memory cell, a pre-charge voltage is passed to the at least one program inhibited memory cell to provide a pre-charge voltage to its channel. Additionally, a pre-charge voltage is passed to a buffering memory cell located on the source side of the at least one program inhibited memory cell to provide a pre-charge voltage to a channel of the buffering memory cell.

At step 1507, the gating memory cell that is located on the drain side of the program inhibited memory cell is turned off.

At step 1509, a program voltage is applied to the word line that is associated with the memory cell to be programmed and a channel voltage of the program inhibited memory cell is raised above a level raised by the pre-charge voltage.

At step 1511, a value (e.g., logic level 0 or 1) is stored in the memory cell that is to be programmed.

With reference to exemplary embodiments thereof, a method for partial local self-boosting of a memory cell channel is disclosed. As a part of memory cell channel partial local self-boosting, an isolating memory cell located on a source side of a program inhibited memory cell is turned off and a gating memory cell located on a drain side of the program inhibited memory cell is used to pass a pre-charge voltage to the program inhibited memory cell to provide a pre-charge voltage to a channel of the program inhibited memory cell. Moreover, a pre-charge voltage is passed to a buffering memory cell located on the source side of the program inhibited memory cell to provide a pre-charge voltage to a channel of the buffering memory cell and the gating memory cell that is located on the drain side of the program inhibited memory cell is turned off. During programming, a program voltage is applied to the gate of the program inhibited memory cell where a channel voltage of the program inhibited memory cell is raised above a level raised by the pre-charge voltage.

The foregoing descriptions of specific embodiments have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for partial local self-boosting of a memory cell channel, comprising:
   turning off an isolating memory cell located on a source side of a program inhibited memory cell;
   using a gating memory cell located on a drain side of said program inhibited memory cell, passing pre-charge voltage to said program inhibited memory cell to provide a pre-charge voltage to a channel of said program inhibited memory cell and passing pre-charge voltage to a buffering memory cell located on said source side of said program inhibited memory cell to provide a pre-charge voltage to a channel of said buffering memory cell;
   turning off said gating memory cell that is located on said drain side of said program inhibited memory cell; and
   during programming, applying a programming voltage to the gate of said program inhibited memory cell wherein a channel voltage of said program inhibited memory cell is raised beyond a level raised by said pre-charge voltage.

2. The method of claim 1 wherein said turning off said gating memory cell is done by lowering the voltage applied to the gate of said gating memory cell.

3. The method of claim 1 wherein said turning off said gating memory cell is done without lowering the voltage applied to the gate of said gating memory cell.

4. The method of claim 1 wherein turning off said isolating memory cell comprises applying a voltage of zero volts or other turn-off voltage to the gate of said isolating memory cell.

5. The method of claim 1 further comprising applying a predetermined voltage to the gate of said buffering memory cell located adjacent to said program inhibited memory cell on the source side of said program inhibited memory cell.

6. The method of claim 1 wherein different voltages are applied to the gates of memory cells located on the drain side of said program inhibited memory cell.

7. The method of claim 1 wherein said gating memory cell is selected to control leakage current.

8. The method of claim 1 wherein said gating memory cell is selected from among a plurality of memory cells that are located on the drain side of said program inhibited memory cell.

9. A method of programming a NAND memory cell, comprising:
- identifying a memory cell to be programmed;
- passing pre-charge voltage to a program inhibited memory cell associated with said memory cell to be programmed to provide a pre-charge voltage to the channel of said program inhibited memory cell;
- turning off a gating memory cell that is located on the drain side of said program inhibited memory cell;
- applying a program voltage to the gate of said memory cell to be programmed and to the gate of said program inhibited memory cell wherein a channel voltage of said program inhibited memory cell is raised above the voltage level to which it is raised by said pre-charge voltage; and
- storing a value in said memory cell to be programmed.

10. The method of claim 9 wherein said turning off said gating memory cell is done by lowering the voltage applied to the gate of said gating memory cell.

11. The method of claim 9 wherein said turning off said gating memory cell is done without lowering the voltage applied to the gate of said gating memory cell.

12. The method of claim 9 wherein turning off said isolating memory cell comprises applying a voltage of zero volts or other turn-off voltage to the gate of said isolating memory cell.

13. The method of claim 9 further comprising applying a predetermined voltage to the gate of said buffering memory cell located adjacent to said program inhibited memory cell on the source side of said program inhibited memory cell.

14. The method of claim 9 wherein different voltages are applied to the gates of memory cells located on the drain side of said program inhibited memory cell.

15. The method of claim 9 wherein said gating memory cell is selected to control leakage current.

16. The method of claim 9 wherein said gating memory cell is selected from among a plurality of memory cells that are located on the drain side of said program inhibited memory cell.

17. In a NAND memory cell array comprising a plurality of NAND memory cell strings, a method for programming a memory cell, comprising:
- selecting a word line that is associated with a memory cell of said NAND memory cell array to be programmed and at least one program inhibited memory cell;
- turning off an isolating memory cell located on a source side of said at least one program inhibited memory cell;
- using a gating memory cell located on a drain side of said at least one program inhibited memory cell, passing pre-charge voltage to said at least one program inhibited memory cell to provide a pre-charge voltage to a channel of said at least one program inhibited memory cell and passing pre-charge voltage to a buffering memory cell located on said source side of said at least one program inhibited memory cell to provide a pre-charge voltage to a channel of said buffering memory cell;
- turning off said gating memory cell that is located on said drain side of said program inhibited memory cell; and
- applying a program voltage to said word line wherein a channel voltage of said program inhibited memory cell is raised above a level raised by said pre-charge voltage; and
- storing said program voltage in said memory cell to be programmed.

18. The method of claim 17 wherein said turning off said gating memory cell is done by lowering the voltage applied to the gate of said gating memory cell.

19. The method of claim 17 wherein said turning off said gating memory cell is done without lowering the voltage applied to the gate of said gating memory cell.

20. The method of claim 17 further comprising applying a predetermined voltage to the gate of said buffering memory cell located adjacent to said program inhibited memory cell on the source side of said program inhibited memory cell.

* * * * *